United States Patent
Berry, Jr. et al.

(10) Patent No.: US 7,430,487 B2
(45) Date of Patent: Sep. 30, 2008

(54) SYSTEM AND METHOD FOR IMPLEMENTING A PROGRAMMABLE DMA MASTER WITH DATA CHECKING UTILIZING A DRONE SYSTEM CONTROLLER

(75) Inventors: Robert W. Berry, Jr., Round Rock, TX (US); Michael Criscolo, Cedar Park, TX (US); Christopher J. Kuruts, Round Rock, TX (US); James P. Kuruts, Round Rock, TX (US); Steven J. Smolski, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 7 days.

(21) Appl. No.: 11/470,282

(22) Filed: Sep. 6, 2006

(65) Prior Publication Data

US 2008/0059103 A1 Mar. 6, 2008

(51) Int. Cl.
*G11C 29/00* (2006.01)
*G06F 19/00* (2006.01)

(52) U.S. Cl. .................. 702/117; 702/186; 714/718
(58) Field of Classification Search .................. 702/186
See application file for complete search history.

(56) References Cited

U.S. PATENT DOCUMENTS

| 7,178,076 B1 * | 2/2007 | Zarrineh et al. .............. 714/733 |
| 2001/0013110 A1 * | 8/2001 | Pierce et al. ................. 714/718 |
| 2004/0230395 A1 * | 11/2004 | Basto ......................... 702/117 |

* cited by examiner

*Primary Examiner*—Bryan Bui
*Assistant Examiner*—Jonathan Teixeira Moffat
(74) *Attorney, Agent, or Firm*—D'Ann N. Rifai; Dillon & Yudell LLP

(57) ABSTRACT

A method, system, and computer-usable medium for implementing a programmable DMA master with data checking utilizing a drone system controller. According to an embodiment of the present invention, a drone processor generates a collection of random data and stores a first and second copy of the collection of random data in a first and second memory location in a drone memory. The drone processor writes a third copy of the collection of random data in a processor memory. When the drone processor retrieves the third copy from the processor memory, the drone processor writes the third copy in the second memory location in the drone memory. When the drone processor compares the first copy with the third copy, the results of the compare is written in a status location within the drone processor.

1 Claim, 2 Drawing Sheets

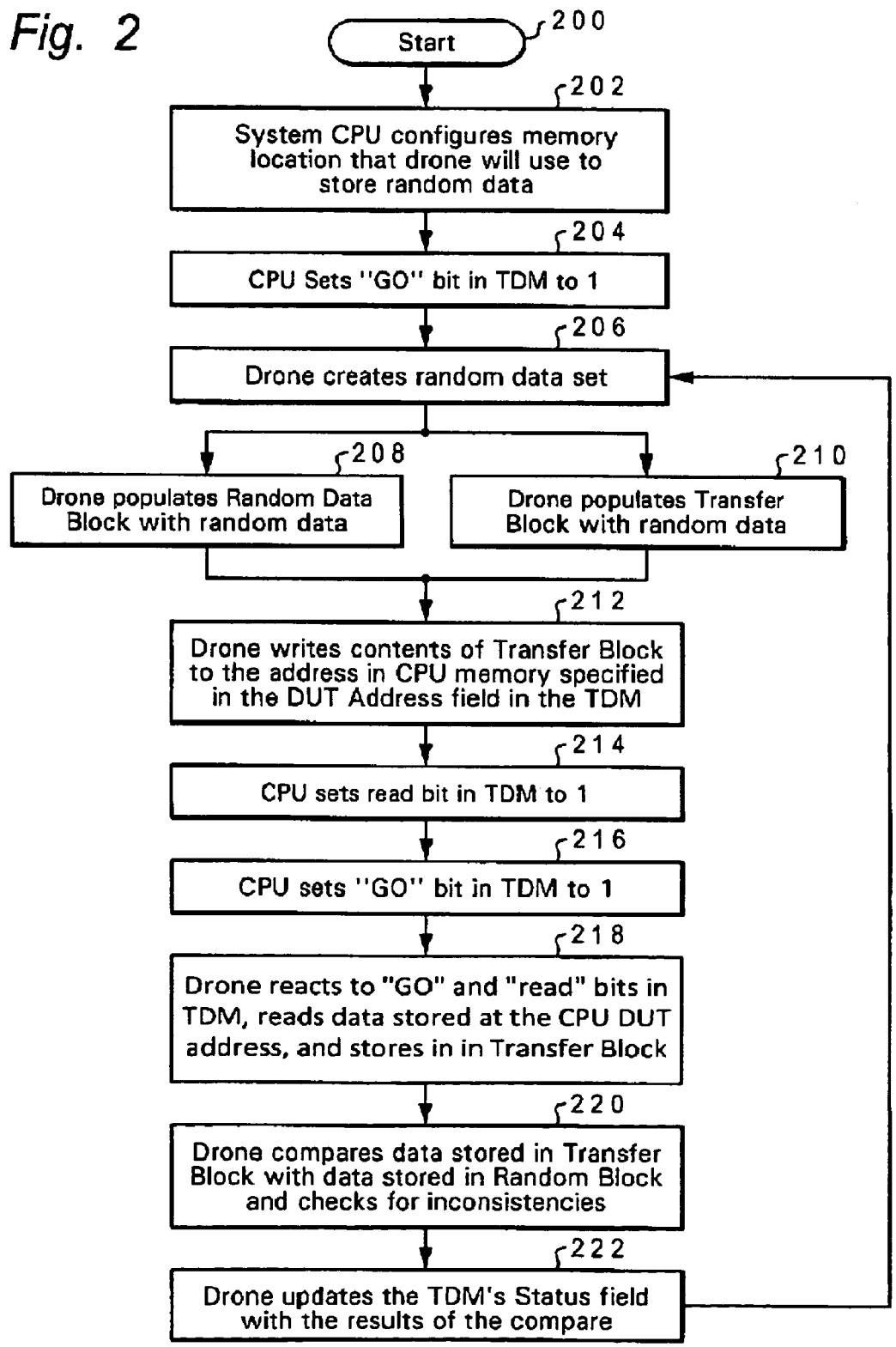

SYSTEM AND METHOD FOR IMPLEMENTING A PROGRAMMABLE DMA MASTER WITH DATA CHECKING UTILIZING A DRONE SYSTEM CONTROLLER

CROSS REFERENCE TO RELATED APPLICATIONS

The present application is related to the following U.S. patent applications filed concurrently herewith: U.S. patent application Ser. No. 11/470,479; U.S. patent application Ser. No. 11/470,478; and U.S. patent application Ser. No. 11/470, 507. The above-mentioned patent applications are assigned to the assignee of the present invention and are incorporated herein by reference in their entirety.

BACKGROUND OF THE INVENTION

1. Technical Field

The present invention relates in general to the field of data processing systems and in particular, testing data processing systems. Still more particularly, the present invention relates to a system and method of verifying data transferred by data processing systems.

2. Description of the Related Art

Current peripheral component interconnect (PCI) technology for validation typically includes specifically designed controller cards that are both inflexible and non-scaleable. Current implementations also required that each card have a PCI slot dedicated to the input/output exerciser, creating limitations in both space and slot availability. Therefore, there is a need for a system and method for overcoming the aforementioned limitations of the prior art.

SUMMARY OF THE INVENTION

The present invention includes a method, system, and computer-usable medium for implementing a programmable DMA master with date checking utilizing a drone system controller. According to a preferred embodiment of the present invention, a drone processor generates a collection of random data and stores a first and second copy of the collection of random data in a first and second memory location in a drone memory. The drone processor writes a third copy of the collection of random data in a processor memory. When the drone processor retrieves the third copy from the processor memory, the drone processor writes the third copy in the second memory location in the drone memory. When the drone processor compares the first copy with the third copy, the results of the compare is written in a status location within the drone processor.

The above, as well as additional purposes, features, and advantages of the present invention will become apparent in the following detailed written description.

BRIEF DESCRIPTION OF THE FIGURES

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying figures, wherein:

FIG. 2 is a high-level logical flowchart depicting an exemplary method for implementing a programmable DMA master with date checking utilizing a drone system controller.

DETAILED DESCRIPTION OF AN ILLUSTRATIVE EMBODIMENT

Figure 1:
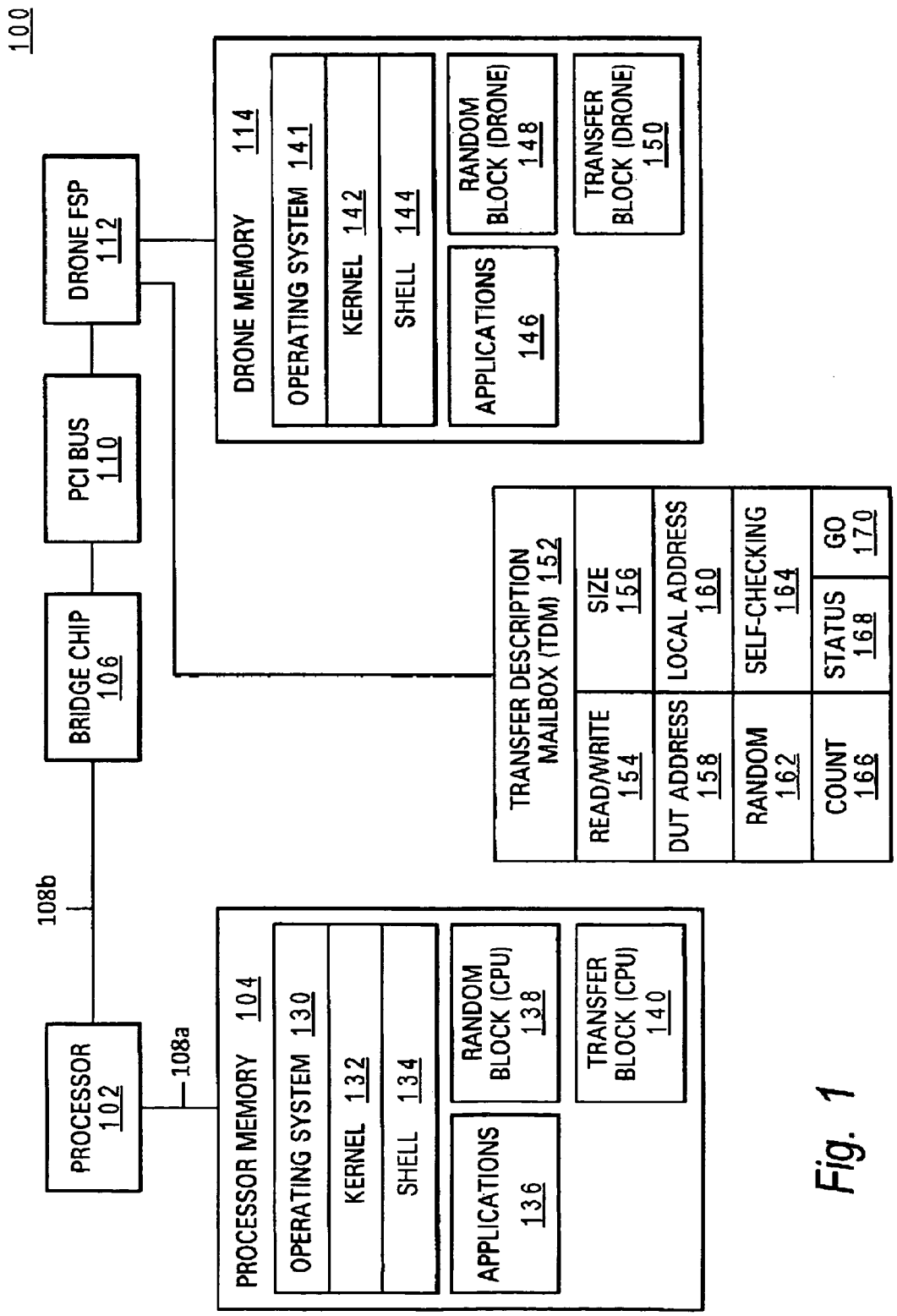
FIG. 1 is a block diagram illustrating an exemplary data processing system in which a preferred embodiment of the present invention may be implemented.

The peripheral component interconnect (PCI) direct memory access (DMA) master of the present invention is an input/output (I/O) exerciser controlled from a drone system controller, which functions independently from the system under test (SUT) and does not require utilization of a card specifically designed to execute the I/O exerciser. The present invention allows the drone system controller to perform simultaneously as an I/O exerciser and a system controller. One embodiment of the present invention allows the I/O exerciser to be scaleable by running the functions on multiple processors, in the event a multiprocessor data processing system is implemented.

Generally, an I/O exerciser transfers and compares data between devices in a data processing system to determine if the I/O components are operating correctly. In an embodiment of the present invention, the drone flexible support processor (FSP) creates a random data set and stores the random data set in random and transfer blocks within the drone memory. When prompted, the drone FSP transfers the contents of the transfer block within the drone memory to a specified memory location within the processor memory of the SUT. Again, when prompted, the drone FSP reads data stored within the specified memory location within the processor memory of the SUT and stores the data in a drone local address within drone memory (usually, the drone transfer block). The drone FSP compares the data stored in the drone random block and the drone transfer block for inconsistencies.

Referring now to the figures, and in particular, referring to FIG. 1, there is illustrated a block diagram depicting an exemplary data processing system 100 in which a preferred embodiment of the present invention may be implemented. As depicted, data processing system 100 includes a processor 102, which is coupled to processor memory 104 and bridge chip 106 via interconnects 108*a-b*. Bridge chip 106 couples processor 102 with drone flexible support processor (FSP) 112 via peripheral component interconnect (PCI) bus 110. Coupled to drone FSP 112 is drone memory 114. In a preferred embodiment of the present invention, processor 102, processor memory 104, bridge chip 106, PCI bus 110 represent a system under test (SUT). On the other hand, the drone FSP 112 and drone memory 114 represent the PCI DMA master functioning as both a system controller and an I/O exerciser.

Also, as illustrated, stored with processor memory 104 is operating system 130, which further includes shell 134 for providing transparent user access to resources such as application programs 136. Generally, shell 134 is a program that provides an interpreter and an interface between the user and the operating system. More specifically, shell 134 executes commands that are entered into a command line user interface or a file. Thus, shell 134 (as it is called in UNIX®), also called a command processor in Windows®, is generally the highest level of the operating system software hierarchy and serves as a command interpreter. The shell provides a system prompt, interpret commands entered by keyboard, mouse, or other user input media, and sends the interpreted command(s) to the appropriate lower levels of the operating system (e.g., kernel 132) for processing. Note that while shell 134 is a text-based, line-oriented user interface, the present invention will support other user interface modes, such as graphical, voice, gestural, etc. equally well.

Operating system 130 also includes kernel 132, which includes lower levels of functionality for operating system 130, including providing essential services required by other parts of operating system 130 and application programs 136, including memory management, process and task management, disk management, and mouse and keyboard management. Application programs 136 can include a browser, utilized for access to the Internet, word processors, spreadsheets, and other application programs. Also, as depicted in FIG. 1, processor memory 104 includes random block (CPU) 138 and transfer block (CPU) 140, which are both discussed herein in more detail in conjunction with FIG. 2. Drone memory 140 includes similar components as processor memory 104, such as operating system 141, kernel 142, shell 144, applications 146, random block (drone) 148, and transfer block (drone) 150, discussed herein in more detail in conjunction with FIG. 2.

Drone FSP 112 includes a transfer description mailbox (TDM) 152 that includes a collection of fields utilized to implement an embodiment of the present invention. This collection of fields includes read/write 154, size 156, DUT address 158, local address 160, random 162, self-checking 164, count 166, status 168, and go 170.

Those with skill in the art will appreciate that data processing system 100 can include many additional components not specifically illustrated in FIG. 1. Because such additional components are not necessary for an understanding of the present invention, they are not illustrated in FIG. 1 or discussed further herein. It should be understood, however, that the enhancements to data processing system 100 to implement a programmable DMA master with date checking utilizing a drone system controller are applicable to data processing systems of any system architecture and are in no way limited to the generalized processor architecture illustrated in FIG. 1.

FIG. 2 is a high-level logical flowchart illustrating an exemplary method for implementing a programmable DMA master with date checking utilizing a drone system controller according to a preferred embodiment of the present invention. The process begins at step 200 and proceeds to step 202, which illustrates processor 102 configuring memory locations (e.g., random block (CPU) 138 and transfer block (CPU) 140) within processor memory 104 that drone FSP 112 will utilize to store random data sets. Processor 102 sends the addresses of the transfer. The process continues to step 204, which illustrates processor 102 setting a "go" bit 170 within TDM 152 to "1". The process proceeds to step 206, which shows drone FSP 112 generating a random data set.

The process proceeds to steps 208 and 210, which illustrate drone FSP 112 storing random block (drone) 148 and transfer block (drone) 150 with the generated random data. Drone FSP 112 writes contents of transfer block (drone) 150 to an address in processor memory 104 specified in DUT address field 158 (e.g., address of transfer block (CPU) 140) in TDM 152, as shown in step 212. The process continues to step 214, which depicts processor 102 setting a read bit stored in TDM 152 to "1" and setting a "go" bit 170 in TDM 152 to "1", as depicted in step 216.

The process continues to step 218, which illustrates drone FSP 112 reacting to the "go" 170 and "read" 154 bits in TDM 152, reads data stored at the DUT address 158 in processor memory 104, and stores the data in transfer block (drone) 150, which is specified by local address 160 in TDM 152. The process proceeds to step 220, which illustrates drone FSP 112 comparing data stored in transfer block (drone) 150 with data stored in random block (drone) 148 and checks for inconsistencies between the data. Drone FSP 112 updates status field 168 in TDM 152 with the results of the compare, as illustrated in step 222. The process returns to step 206 and proceeds in an iterative fashion.

As discussed, the present invention includes a method, system, and computer-usable medium for implementing a programmable DMA master with date checking utilizing a drone system controller. According to a preferred embodiment of the present invention, a drone processor generates a collection of random data and stores a first and second copy of the collection of random data in a first and second memory location in a drone memory. The drone processor writes a third copy of the collection of random data in a processor memory. When the drone processor retrieves the third copy from the processor memory, the drone processor writes the third copy in the second memory location in the drone memory. When the drone processor compares the first copy with the third copy, the results of the compare is written in a status location within the drone processor.

It should be understood that at least some aspects of the present invention may alternatively be implemented in a computer-usable medium that contains a program product. Programs defining functions in the present invention can be delivered to a data storage system or a computer system via a variety of signal-bearing media, which include, without limitation, non-writable storage media (e.g., CD-ROM), writable storage media (e.g., hard disk drive, read/write CD-ROM, optical media), system memory such as, but not limited to Random Access Memory (RAM), and communication media, such as computer and telephone networks including Ethernet, the Internet, wireless networks, and like network systems. It should be understood, therefore, that such signal-bearing media when carrying or encoding computer-readable instructions that direct method function sin the present invention represent alternative embodiments of the present invention. Further, it is understood that the present invention may be implemented by a system having means in the form of hardware, software, or a combination of software and hardware as described herein or their equivalent.

When the present invention has been particularly shown and described with reference to a preferred embodiment, it will be understood by those skilled in the art that various changes in form and detail may be made therein without departing from the spirit and scope of the invention. Furthermore, as used in the specification and the appended claims, the term "computer" or "system" or "computer system" or "computing device" includes any data processing system including, but not limited to, personal computers, servers, workstations, network computers, mainframe computers, routers, switches, personal digital assistants (PDAs), telephones, and any other system capable of processing, transmitting, receiving, capturing, and/or storing data.

What is claimed is:

1. A method for checking data transferred within a data processing system, wherein said data processing system includes a main processor coupled to a processor memory and a flexible support processor coupled to a flexible support processor memory, said method comprising:

generating a plurality of random data utilizing said flexible support processor;

storing a first and second copy of said plurality of random data in a first and a second memory location of said flexible support processor memory;

wherein said first memory location is a random block within said flexible support processor memory and said second memory location is a transfer block within said flexible support processor memory;

configuring, by said main processor, a memory location in said processor memory for said flexible support processor to store a third copy of said plurality of random data;

writing the third copy of said plurality of random data in said memory location in the processor memory;

in response to said flexible support processor retrieving said third copy from said processor memory, automatically writing said third copy in said second memory location in said flexible support processor memory;

comparing said first copy with the third copy to detect a presence of one or more inconsistencies between the first copy and the third copy; and when said flexible support processor detects an inconsistency between said first copy with said third copy, writing results of said compare in a status location within a transfer description mailbox (TDM) associated with said flexible support processor;

wherein the flexible support processor with associated TDM and flexible support processor memory provides a controller functionality of a peripheral component interconnect (PCI) direct memory access (DMA) master, which concurrently functions as both a system controller and an input/output (I/O) exerciser, wherein the I/O exerciser functions independently from a system under test (SUT) and does not require utilization of a card specifically designed to execute the I/O exerciser.

* * * * *